United States Patent [19]
Burns

[11] Patent Number: 5,008,777
[45] Date of Patent: Apr. 16, 1991

[54] AUXILIARY BOARD SPACER ARRANGEMENT

[75] Inventor: William F. Burns, Plano, Ill.

[73] Assignee: AT&T Bell Laboratories, Murray Hill, N.J.

[21] Appl. No.: 257,654

[22] Filed: Oct. 14, 1988

[51] Int. Cl.⁵ .............................................. H05K 1/14
[52] U.S. Cl. ................................. 361/412; 174/138 G
[58] Field of Search ............... 361/412, 417, 419, 420; 174/138 D, 138 G; 211/41, 87; 248/220.2, 220.3

[56] References Cited

U.S. PATENT DOCUMENTS

| | | | |
|---|---|---|---|
| 3,688,635 | 9/1972 | Fegen | 85/5 R |
| 3,836,703 | 9/1974 | Coules | 174/138 D |
| 3,996,500 | 12/1976 | Coules | 317/101 CC |
| 4,200,900 | 4/1980 | McGeorge | 316/412 |
| 4,444,318 | 4/1984 | Alexander | 211/41 |
| 4,495,380 | 1/1985 | Ryan et al. | 361/412 X |
| 4,578,612 | 3/1986 | Mooney | 174/138 G |

FOREIGN PATENT DOCUMENTS 2208929  8/1972  Fed. Rep. of Germany ...... 361/419

Primary Examiner—Leo P. Picard
Assistant Examiner—Paramita Ghosh
Attorney, Agent, or Firm—Werner Ulrich

[57] ABSTRACT

A method and apparatus for mounting daughter boards onto a printed circuit mother board. Daughter boards are mounted on the mother board using a new spacer. This spacer comprises: an electrically insulated body; one or more pins protruding from one end of the body which fit into the circuit component holes of the mother board; and a hole at the other end of the body which accepts a fastening device inserted through a hole in a daughter board, that attaches a daughter board to the mother board. Advantageously, a minimum amount of space is used on the mother board, and the daughter boards can be mounted wherever convenient.

21 Claims, 1 Drawing Sheet

AUXILIARY BOARD SPACER ARRANGEMENT

This invention was made with Government support under Contract No. DCA100-86-C-0015 awarded by the Defense Communication Agency. The government has certain rights in this invention.

TECHNICAL FIELD

This invention relates to apparatus and methods for mounting printed circuit boards.

PROBLEM

Printed circuit boards are widely used for mounting and interconnecting electronic components. Auxiliary circuit boards attached to a primary board are often used when a primary circuit board or mother board cannot accommodate all of the components required to perform the functions of a circuit. Spacers are commonly used for mounting an auxiliary board or daughter board onto a mother board.

Such spacers are often arranged to be attached to the edges of the mother boards. This severely limits the number of locations where a daughter board can be mounted onto a mother board and the size and shape of the daughter boards.

Other spacers that need not be attached to the edge of the mother board present other problems. These spacers consist of a large shaft, attached to a mother board by some type of locking member. This type of spacer uses a large amount of surface area on a mother board. Surface area must be preallocated to make room for the spacers, limiting both the number of components that can reside on a mother board and the number of locations where spacers, and therefore, the daughter boards, can be placed.

Prior art spacers are also not suited to automated manufacturing. These spacers cannot be automatically attached to the mother board. Thus, the manufacturing cost of these spacers is high.

SOLUTION

The foregoing problems and deficiencies are solved and an advance is made in the art in an illustrative embodiment of my invention by providing a new spacer, arranged for mounting in the circuit component holes of a mother board, for attaching the daughter boards onto a mother board. A specific embodiment is a phenolic spacer, resembling a tall capacitor. The spacer is attached at one end to the mother board by metal leads inserted into the circuit component holes, and the daughter board is attached to the opposite end of the spacer by a metal screw. Advantageously, this spacer provides a rigid connection which does not easily break during testing or shipping. Advantageously, such a spacer can be placed anywhere on a board. Because the spacer is mounted in circuit component holes of the mother board, the spacer and the fastening device can be inserted, advantageously, by automatic insertion mechanisms into the mother board. This spacer can also be permanently attached, advantageously, to the mother board by wave soldering during manufacturing. Advantageously, these benefits significantly reduce manufacturing costs in comparison with present methods.

In accordance with another aspect of this invention, the leads connecting this spacer to a circuit board are electrically isolated. Consequently and advantageously, this spacer can be employed with single-sided, double-sided, and multilayer printed circuit boards.

Therefore, in accordance with the principles of this invention, one or more leads, protruding from one end of a new spacer for mounting a daughter board, are inserted into the circuit component holes of a mother board. In accordance with one aspect of the invention, the spacer has an opening at the other end for accepting a fastening device, inserted through a hole in the daughter board.

DETAILED DESCRIPTION

Figure 1:
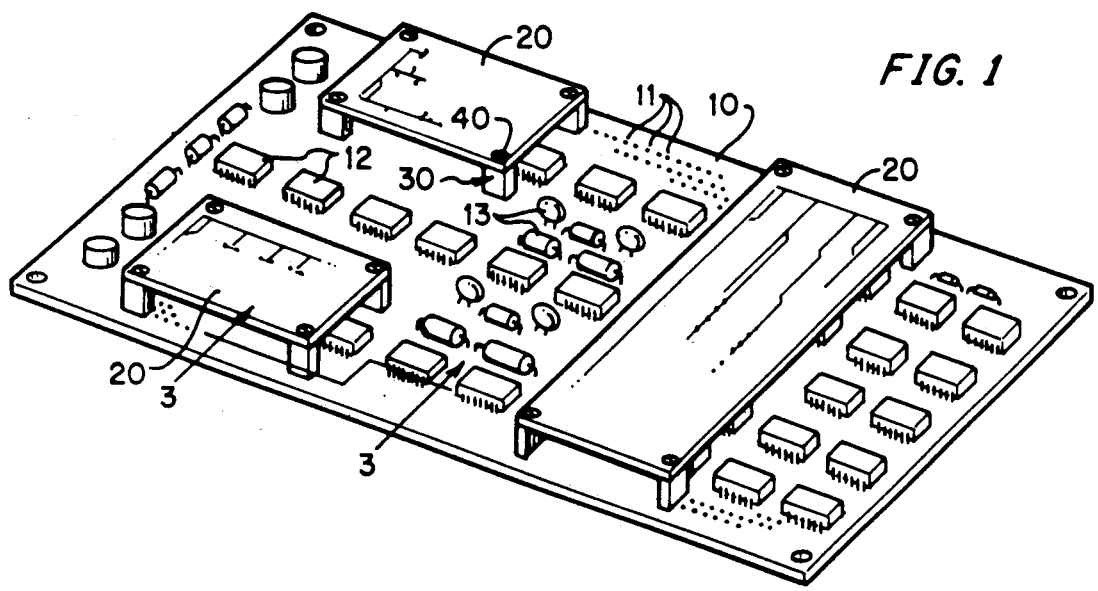
FIG. 1 is a perspective view of daughter boards mounted on a mother board using the spacer.

FIG. 1 illustrates the freedom that the use of the new spacer allows. The mother board 10 comprises circuit component mounting holes 11, and has mounted on its surface a group of integrated circuit chips 12, and discrete components 13. Several daughter boards 20 can be mounted onto a mother board 10 in many possible arrangements. The spacers 30 are of similar cross-sectional size and shape as some of the discrete components 13 on the mother board, although taller to allow the daughter board to clear components mounted underneath. This arrangement consumes a minimum amount of space on the mother board 10 for mounting the daughter boards 20. FIG. 1 shows the use of a screw 40 as a fastening device to attach a daughter board to a spacer 30; however, this invention is not limited to that implementation, but could alternatively use, for example, a snap-in fastening device.

Figure 2:
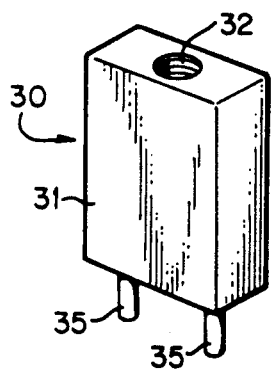
FIG. 2 is a perspective diagram of the spacer itself, showing the body and the metal leads.

FIG. 2 is a close-up perspective diagram of the spacer 30 used to mount the daughter 20 boards onto the mother board 10 in FIG. 1. The spacer consists of a phenolic rectangular prismatic shaped body 31 that has a wall 37 defining a threaded hole 32 in the top center. The wall contains threaded grooves that are required for the insertion of a fastening device, in this case, a screw 40. The spacer also comprises two metal leads 33 with pins 35 that extend from the bottom of the body 31. The leads are of a size and separation such that they fit into the component circuit holes 11 of the mother board 10. In the specific embodiment of the invention, as shown in detail in FIG. 3, inner walls 38 defining holes for the leads, slightly larger than the leads 33, and a housing 36 for glue are drilled into the body 31 of the spacer. Metal leads 33 with top portion 34 and pins 35 are then press fitted through the holes and glued into the housing 36. The invention is not limited to this implementation, however; for example, the leads could alternatively be integrally molded into the body 31 of the spacer.

Figure 3:
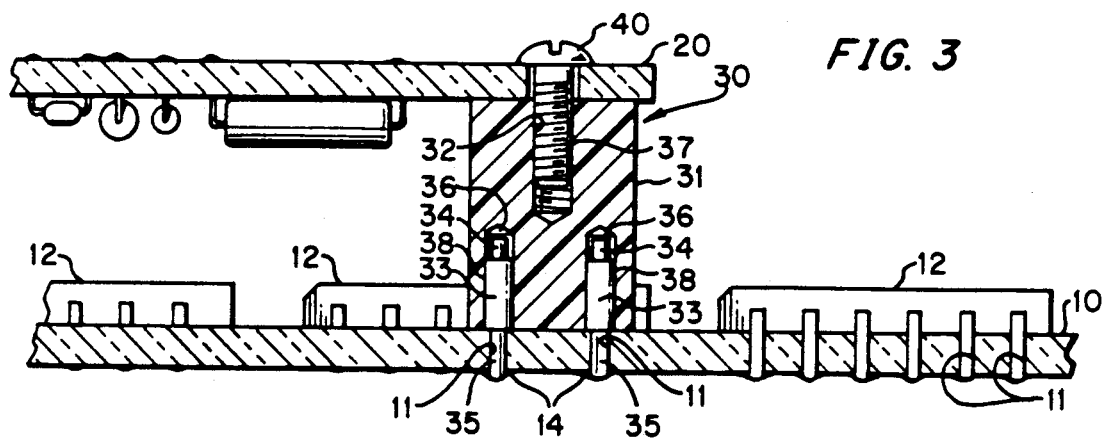
FIG. 3 is a close-up cross-sectional view taken along the lines of 3—3 of FIG. 1., exposing the interior of the spacer, illustrating how the spacer connects two boards.

FIG. 3 is a close-up cross-sectional view of the connection of a daughter board 20 to a mother board 10, using the spacer 30. First notice the interior view of the spacer. The metal leads 33 each comprise a slightly tapered top portion 34 and a cylindrically shaped pin 35 as a bottom portion, which extends from the body 31 of the spacer. The spacer 30 is affixed to the mother board 10 by inserting the pins 35 into the component circuit holes 11 of the mother board 10, and soldering the pins 35 to the mother board 10, as indicated by a piece of solder 14.

A daughter board 20 is mounted onto the mother board 10 by inserting a fastening device 40, a screw in the specific embodiment, through a hole in the daughter board 20, and then inserting the fastening device into the threaded hole 32, located on the body 40 of the spacer. The phenolic material of the spacer body 31 electrically isolates the metal leads 33 from the metal screw 40. Similarly, the pins 35 connecting the spacer 30 to the mother board 10 are totally insulated from each other by the phenolic material of the body 31. This spacer forms a rigid, electrically insulated connection between the mother board and the daughter board.

I claim:

1. A method of connecting a daughter board to a mother board, the mother board having a plurality of circuit component holes for mounting discrete components and integrated circuits, comprising the steps of:
    inserting a spacer means comprising at least one spacer body and at least one pin, inserted into and protruding from one end of the at least one spacer body, into the mother board by insertion of the at least one pin into at least one of the circuit component holes of the mother board.

2. The method of claim 1, wherein each spacer body comprises a means defining a hole at an end opposite the one end, further comprising the step of inserting a fastening device through a hole in the daughter board into the means defining a hole of the at least one spacer body.

3. The method of claim 1, wherein said mother board comprises at least two layers of wiring.

4. A method of connecting a daughter board to a mother board, the mother board having a plurality of circuit component holes for mounting discrete components and integrated circuits, comprising the steps of:
    inserting a spacer means comprising at least one spacer body and at least one pin, inserted into and protruding from one end of the at least one spacer body, into the mother board by insertion of the at least one pin into at least one of the circuit component holes of the mother board, wherein each spacer body comprises a means defining a hole at an end opposite the one end, further comprising the step of inserting a fastening device through a hole in the daughter board into the means defining a hole of the at least one spacer body and
    wherein the at least one spacer body comprises a means defining a cavity at the one end thereof, and further comprising the step of force fitting the at least one pin into the cavity, prior to the insertion step.

5. The method of claim 4, further comprising the step of integrally molding the at least one pin into the at least one spacer body.

6. The method of claim 4, further comprising the step of affixing the at least one pin to the mother board by a solder connection.

7. An arrangement of connected first and second circuit boards comprising:
    at least one first board, each first board comprising at least one mounting hole;
    a second board, comprising a plurality of circuit component holes for mounting discrete components and integrated circuits; and
    at least one spacer means, each spacer means for spatially attaching the at least one first board to the second board;
    wherein each of the spacer means comprises:
    at least one body having a means defining a hole at one end;
    pin means protruding from the at least one body at an end opposite the one end, and inserted into the circuit component holes of the second board, and soldered to the second board for connecting the spacer means to the second board; and
    a fastening device inserted through one of the mounting holes of one of the first boards and into the means defining a hole in the at least one body, for connecting the spacer means to a first board.

8. The arrangement of claim 7, wherein the at least one body is composed of electrically insulating material.

9. The arrangement of claim 8, wherein the electrically insulating material is phenol.

10. The arrangement of claim 7, wherein the at least one spacer body is of rectangular prismatic shape.

11. The arrangement of claim 7, wherein the fastening device is a metal screw.

12. The arrangement of claim 7, wherein the pin means comprises two pins.

13. The arrangement of claim 12, wherein a protruding section of each of the two pins is of cylindrical shape.

14. The arrangement of claim 13, wherein each of the two pins further comprises a metallic material.

15. The arrangement of claim 7, wherein the spacer means comprises four spacer bodies.

16. The arrangement of claim 7 wherein said mother board comprises at least two layers of wiring.

17. An arrangement of connected first and second circuit boards comprising:
    at least one first board, each first board comprising at least one mounting hole;
    a second board, comprising a plurality of circuit component holes for mounting discrete components and integrated circuits; and
    at least one spacer means, each spacer means for spatially attaching the at least one first board to the second board;
    wherein each of the spacer means comprises:
    at least one body having a means defining a hole at one end;
    pin means protruding from the at least one body at an end opposite the one end, and inserted into the circuit component holes of the second board, and soldered to the second board for connecting the spacer means to the second board; and
    a fastening device inserted through one of the mounting holes of one of the first boards and into the means defining a hole in the at least one body, for connecting the spacer means to a first board, wherein the pin means comprises two pins, wherein a protruding section of each of the two pins is of cylindrical shape, and wherein each of the two pins comprises a tapered top portion.

18. The arrangement of claim 17, wherein the at least one spacer body comprises a means defining a hole having a housing for glue, and each of the two pins are force fitted into the means defining a hole, and the tapered top portion of each of the two pins is glued into the housing.

19. A spacer for use in attaching a first board, having a hole therein, to a second board, having a plurality of circuit component holes for mounting discrete components, comprising:
- a rectangularly prismatic shaped body composed of phenolic material, and having a means defining a threaded hole at one end for receiving a threaded screw, and having a means defining two tapered holes at the end opposite the one end for receiving two metallic pins;
- two metallic pins joined to the body, and a cylindrical section of each of the two pins protruding from the body at an end opposite the one end, for insertion into circuit component holes of the second board, and being solderable to the second board for affixing the spacer to the second board; and
- a threaded screw fastening device, to join the first board to the second board.

20. An arrangement of connected first and second boards comprising:
- at least one first board, each first board comprising at least one mounting hole;
- a second board, comprising a plurality of circuit component holes for mounting discrete components and integrated circuits; and
- at least one spacer means, each spacer means for attaching one of the first boards to the second board;
- wherein each of the spacer means comprises four spacers, each spacer comprising:
  - a rectangularly prismatic shaped body composed of phenolic material, and having a means defining a threaded hole at one end for accepting a threaded metal screw, and having a means defining two tapered holes, each having a housing for glue, at the end opposite the one end, each for accepting a metallic pin;
  - two metallic pins, each comprising a tapered top portion, and a cylindrically shaped bottom portion;
  - each pin force fitted into the means defining a tapered hole, and the tapered top portion glued into the housing, and each of the cylindrically shaped bottom portions protruding from the body at an end opposite the one end, for insertion into the circuit component holes of the second board, and solderable to the second board for affixing the spacer to the second board; and
  - a threaded metal screw, inserted through one the mounting holes of a first board and into the means defining the threaded hole of the spacer body, for connecting the spacer to the second board.

21. The arrangement of claim 20 wherein said mother board comprises at least two layers of wiring.

* * * * *